(12) United States Patent  (10) Patent No.: US 9,406,574 B1
Byun et al.  (45) Date of Patent: Aug. 2, 2016

(54) OXIDE FORMATION IN A PLASMA PROCESS

(71) Applicant: Cypress Semiconductor Corporation, San Jose, CA (US)

(72) Inventors: Jeong Soo Byun, Cupertino, CA (US); Krishnaswamy Ramkumar, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/562,462

(22) Filed: Dec. 5, 2014

Related U.S. Application Data

(63) Continuation-in-part of application No. 14/473,634, filed on Aug. 29, 2014, now abandoned, which is a continuation of application No. 13/401,712, filed on Feb. 21, 2012, now Pat. No. 8,822,349, which is a continuation of application No. 11/836,683, filed on Aug. 9, 2007, now Pat. No. 8,119,538.

(51) Int. Cl.

| | |
|---|---|
| *H01L 21/31* | (2006.01) |
| *H01L 21/66* | (2006.01) |
| *H01L 21/28* | (2006.01) |
| *H01L 21/02* | (2006.01) |
| *H01L 29/16* | (2006.01) |
| *H01L 29/06* | (2006.01) |
| *H01L 29/51* | (2006.01) |

(52) U.S. Cl.
CPC ............ *H01L 22/26* (2013.01); *H01L 21/0223* (2013.01); *H01L 21/02252* (2013.01); *H01L 21/02323* (2013.01); *H01L 21/02326* (2013.01); *H01L 21/28282* (2013.01); *H01L 22/12* (2013.01); *H01L 29/0676* (2013.01); *H01L 29/16* (2013.01); *H01L 29/511* (2013.01); *H01L 29/518* (2013.01)

(58) Field of Classification Search
CPC ... H01L 22/26; H01L 22/12; H01L 21/28282; H01L 21/02252; H01L 21/0223; H01L 29/16; H01L 29/0676; H01L 29/511; H01L 29/518; H01L 21/02164; H01L 21/02238; H01L 21/02326; H01L 21/02323
USPC ........................................................ 438/770
See application file for complete search history.

(56) References Cited

U.S. PATENT DOCUMENTS

| | | | |
|---|---|---|---|
| 5,434,109 | A | 7/1995 | Geissler et al. |
| 6,271,112 | B1 | 8/2001 | Wooten et al. |
| 6,458,650 | B1 | 10/2002 | Huang et al. |
| 7,763,928 | B2 | 7/2010 | Lin et al. |
| 8,823,077 | B2 | 9/2014 | Lee et al. |

(Continued)

OTHER PUBLICATIONS

U.S. Appl. No. 11/836,683: "Oxide Formation in a Plasma Process" Jeong Soo Byun et al., filed Aug. 9, 2007; 21 pages.

(Continued)

*Primary Examiner* — Savitr Mulpuri

(57) ABSTRACT

A method of making a semiconductor structure is provided. The method includes forming a tunneling layer over a channel connecting a source and a drain formed in a surface of a substrate, forming a charge storage layer overlying the tunneling layer, and forming a blocking structure on the charge storage layer by plasma oxidation. A thickness of the charge storage layer is reduced through oxidation of a portion of the charge storage layer during the formation of the blocking structure. Other embodiments are also described.

9 Claims, 13 Drawing Sheets

(56) References Cited

U.S. PATENT DOCUMENTS

| | | | |
|---|---|---|---|
| 9,018,693 | B2 | 4/2015 | Ramkumar et al. |
| 2002/0004277 | A1 | 1/2002 | Ahn et al. |
| 2002/0013114 | A1 | 1/2002 | Ohtani et al. |
| 2003/0026158 | A1 | 2/2003 | Knall et al. |
| 2005/0045942 | A1 | 3/2005 | Jung |
| 2005/0260107 | A1 | 11/2005 | Jackson et al. |
| 2007/0249127 | A1 | 10/2007 | Mora et al. |
| 2008/0014718 | A1 | 1/2008 | Neyret et al. |
| 2008/0224205 | A1 | 9/2008 | Joshi et al. |
| 2008/0237684 | A1 | 10/2008 | Specht et al. |
| 2008/0251833 | A1 | 10/2008 | Specht et al. |
| 2008/0296655 | A1 | 12/2008 | Lin et al. |
| 2010/0065899 | A1 | 3/2010 | Kim et al. |
| 2011/0204332 | A1 | 8/2011 | Lee et al. |
| 2011/0280076 | A1 | 11/2011 | Samachisa et al. |

OTHER PUBLICATIONS

U.S. Appl. No. 13/401,712: "Oxide Formation in a Plasma Process" Jeong Soo Byun et al., filed Feb. 21, 2012; 22 pages.

USPTO Advisory Action for U.S. Appl. No. 13/401,712 dated Jan. 24, 2014; 3 pages.

USPTO Advisory Action for U.S. Appl. No. 13/401,712 dated Jun. 7, 2013; 3 pages.

USPTO Final Rejection for U.S. Appl. No. 11/836,683 dated Feb. 4, 2010; 13 pages.

USPTO Final Rejection for U.S. Appl. No. 13/401,712 dated Apr. 3, 2013; 17 pages.

USPTO Final Rejection for U.S. Appl. No. 13/401,712 dated Nov. 6, 2013; 13 pages.

USPTO Non-Final Rejection for U.S. Appl. No. 11/836,683 dated Jul. 7, 2009; 15 pages.

USPTO Non-Final Rejection for U.S. Appl. No. 11/836,683 dated Aug. 8, 2011; 17 pages.

USPTO Non-Final Rejection for U.S. Appl. No. 13/401,712 dated Jul. 15, 2013; 5 pages.

USPTO Non-Final Rejection for U.S. Appl. No. 13/401,712 dated Nov. 23, 2012; 15 pages.

USPTO Notice of Allowance for U.S. Appl. No. 11/836,683 dated Dec. 23, 2011; 9 pages.

USPTO Notice of Allowance for U.S. Appl. No. 13/401,712 dated Feb. 28, 2014; 7 pages.

USPTO Notice of Allowance for U.S. Appl. No. 13/401,712 dated Jun. 23, 2014; 7 pages.

USPTO Notice of Allowance for U.S. Appl. No. 14/969,468 dated Feb. 29, 2016; 14 pages.

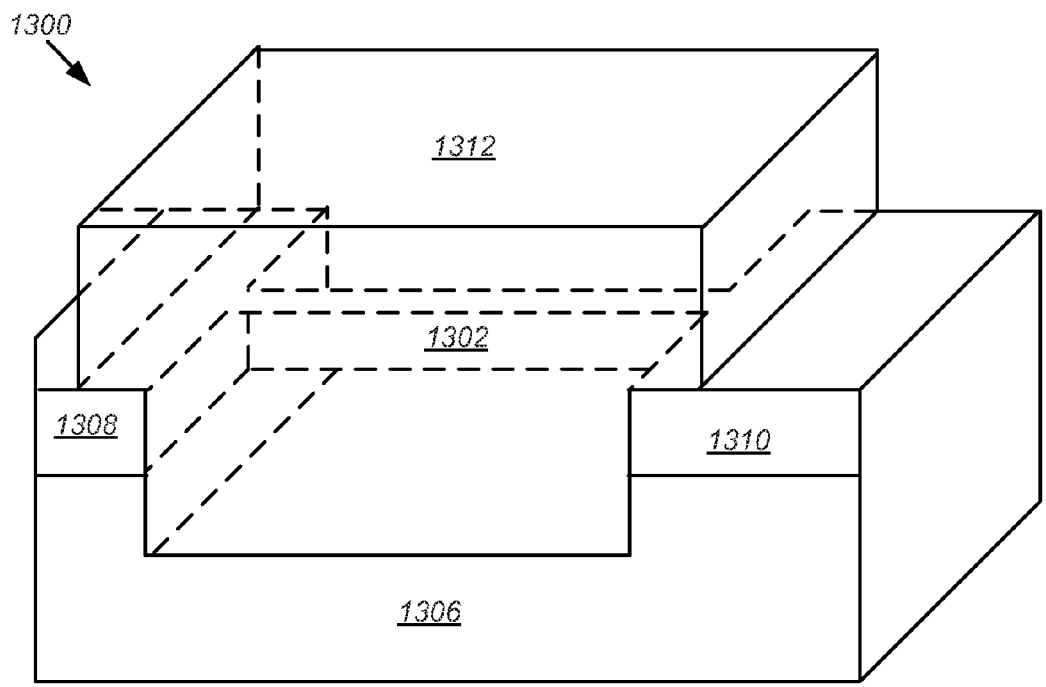
*FIG. 13A*
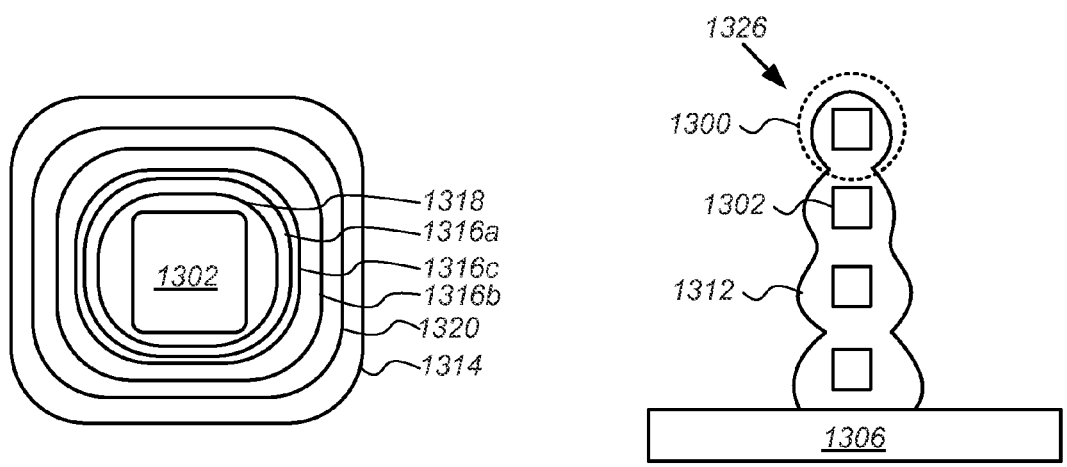
*FIG. 13B*
*FIG. 13C*

US 9,406,574 B1

OXIDE FORMATION IN A PLASMA PROCESS

CROSS-REFERENCE TO RELATED APPLICATIONS

This application is a continuation-in-part of co-pending U.S. application Ser. No. 14/473,634, filed Aug. 29, 2014, which is a continuation of U.S. application Ser. No. 13/401, 712, filed Feb. 21, 2012, now U.S. Pat. No. 8,822,349 issued Sep. 2, 2014, which is a continuation of application of U.S. application Ser. No. 11/836,683, filed Aug. 9, 2007, now U.S. Pat. No. 8,119,538 issued Feb. 21, 2012, all of which are incorporated by reference herein.

TECHNICAL FIELD

The present invention relates to oxide formation of a blocking structure in a plasma process, and more specifically, oxide formation using a high density plasma oxidation process.

BACKGROUND

A variety of methods and structures have been used to form a dielectric layer using oxidation. Some conventional technologies include oxide deposition using a chemical vapor deposition process followed by the addition of heat for densification, an in-situ steam oxidation (ISSG) process, a rapid thermal oxidation process, and a high temperature oxidation (HTO) process. The problem with these conventional technologies is that since they are conducted at temperatures which may exceed 900° C., they require a high thermal budget. These temperatures may cause portions of the structure which is to be formed to become deformed and therefore reduce the accuracy of the structure. Furthermore, high temperature processes such as these may cause diffusion of dopants that will cause shifts in the device electrical parameters. A need exists for a process which can form a layer having oxide at temperatures which do not exceed 900° C.

SUMMARY

In a first aspect, the present invention is a method of making a semiconductor structure. The method includes forming a tunneling layer over a channel connecting a source and a drain formed in a surface of a substrate, forming a charge storage layer overlying the tunneling layer, and forming a blocking structure on the charge storage layer by plasma oxidation. A thickness of the charge storage layer is reduced through oxidation of a portion of the charge storage layer during the formation of the blocking structure.

In a second aspect, the present invention is a method of making a semiconductor structure. The method includes forming a charge storage layer overlying a tunneling layer on a substrate, the charge storage layer comprising a substantially trap free first layer comprising a nitride over the tunneling layer, and a trap dense second layer comprising a nitride over the first layer, and forming a blocking structure on the second layer of the charge storage layer by plasma oxidation. A thickness of the second layer is reduced through oxidation of a portion of the second layer during the formation of the blocking structure.

BRIEF DESCRIPTION OF THE DRAWINGS

The invention can be better understood with reference to the following drawings and description.

FIGS. 13A and 13B illustrate a non-planar multigate device including a split charge storage region and a horizontal nanowire channel;

FIG. 13C illustrates a cross-sectional view of a vertical string of non-planar multigate devices of FIG. 13A;

Figure 1:
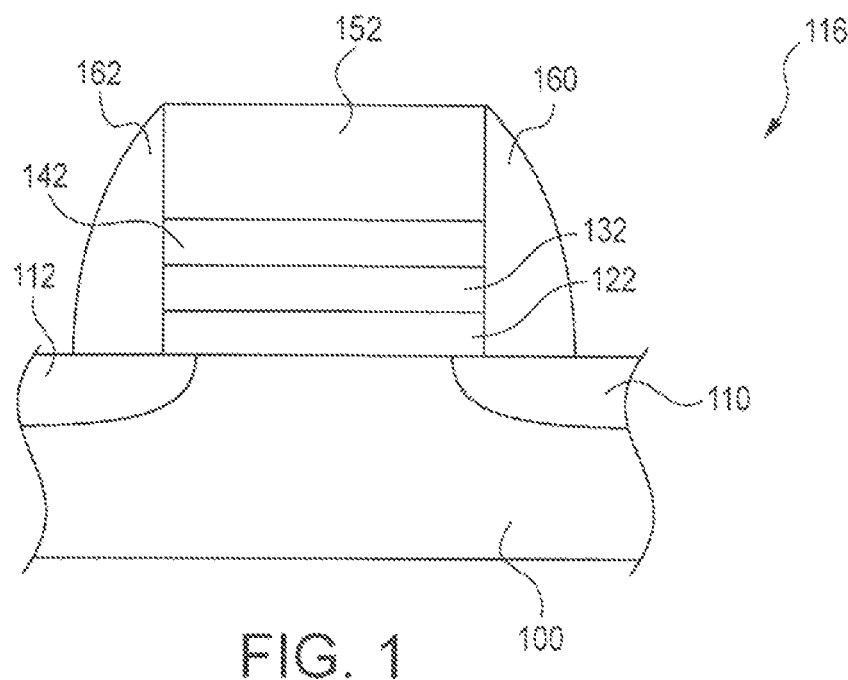
FIG. 1 depicts an edge-on view of a portion of a SONOS type semiconductor device having a blocking structure formed on a storage node.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

The present invention includes a dielectric layer which is formed using a high density plasma oxidation process. By using a high density plasma oxidation process, the dielectric layer can be formed at a much lower temperature than competing deposition processes, such as chemical vapor deposition (CVD), in-situ steam oxidation (ISSG), and rapid thermal oxidation. The lower temperature provides the benefit of a reduced thermal budget and prevents the distortion of certain components which are sensitive to high temperatures, and prevents the diffusion of dopants from critical parts of devices. Additionally, the high density plasma oxidation process results in a dielectric layer having a top surface which is much more uniform and smooth than that formed with competing deposition processes. Moreover, the thickness of a layer beneath the dielectric layer, such as a storage layer, can be reduced during the formation of the dielectric layer to a final thickness which is less than 20 Å. By reducing the thickness of the storage layer to less than 20 Å, semiconductor structures, such as memory cells, can be formed with greater accuracy at smaller sizes. In effect, the invention provides a semiconductor device which has a higher reliability and a reduced manufacturing cost due to the lower thermal budget.

Figure 2:
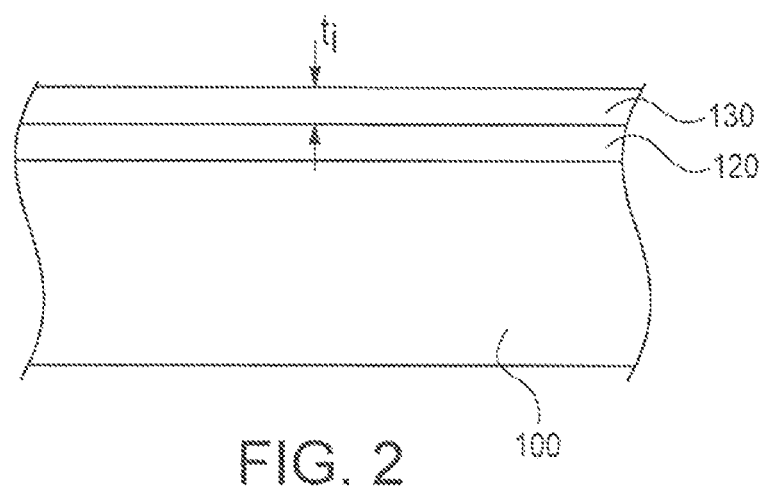
FIGS. 2-3 depict a series of successive edge-on views for forming a portion of the structure of FIG. 1.

Referring to FIG. 2, a storage layer 130 is formed on a first dielectric layer 120, which in turn is formed on a semiconductor substrate 100. Preferably, the semiconductor substrate 100 comprises a single crystal or polycrystalline silicon substrate, however, the semiconductor substrate 100 may comprise other materials. Suitable materials for semiconductor substrate 100 include silicon, gallium arsenide, germanium, gallium nitride, aluminum phosphide, Si1-xGex and AlxGal-xAs alloys, wherein x is greater than or equal to zero and less than or equal to one, the like, and combinations thereof. Additional examples of materials for semiconductor substrate 100 in accordance with the present invention are set forth in Semiconductor Device Fundamentals by Robert F. Pierret (p. 4, Table 1.1, Addison-Wesley, 1996). The substrate 100 is loaded into a HDP system to form a dielectric layer 140 on the storage layer 130 in an oxygen and/or hydrogen ambient. As shown in FIG. 1, source and drain regions 110 and 112 may be formed in the semiconductor substrate 100 by methods well known to those of ordinary skill in the art. The storage layer 130 may comprise SiN, as in a SONOS type device. In one embodiment, the storage layer 130 is a floating gate.

The dielectric layer 120 may comprise silicon nitride, silicon oxynitride, or other oxides, nitrides, or oxynitrides. In one embodiment, the first dielectric layer 120 is formed using a high density plasma (HDP) oxidation process similar to one used to form a second dielectric layer 140, as discussed below. In one embodiment, the dielectric layer 120 forms a tunneling oxide layer comprising $SiO_2$, $SiO_2/Si_3N_4$, or $Si/SiO_2$.

Figure 3:
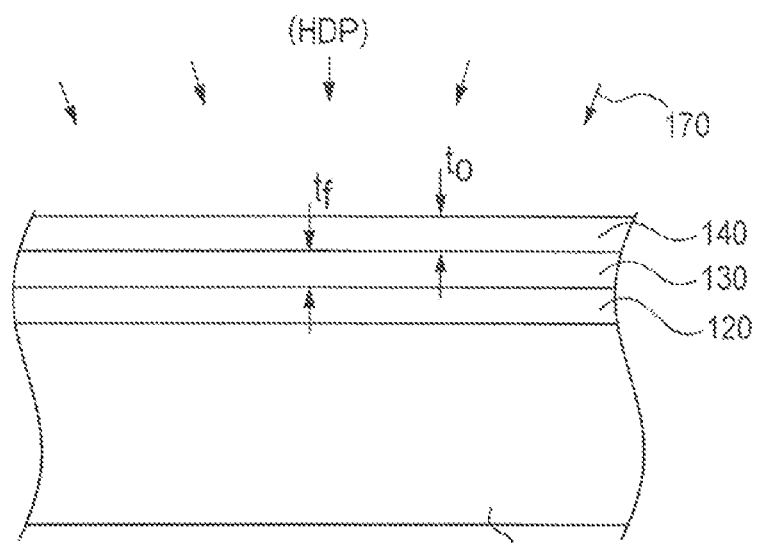
Figure 4:
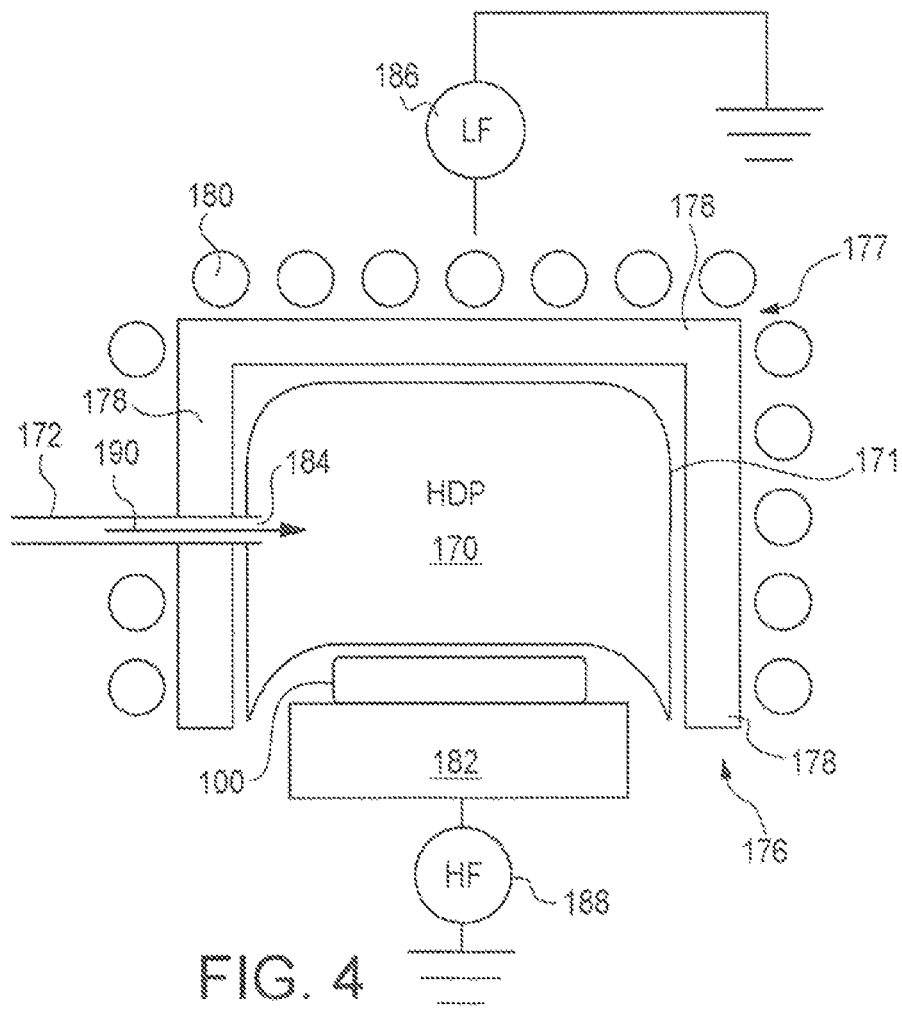
FIG. 4 depicts the structure shown in FIG. 3 being formed within a High Density Plasma (HDP) device.

Referring to FIGS. 3 and 4, a second dielectric layer 140 is formed on the storage layer 130 using a high density plasma (HDP) oxidation process. This same HDP oxidation process can also be used to form the first dielectric layer 120. Additionally, this same HDP oxidation process can also be used to form any dielectric layer described herein. Moreover, this same HDP oxidation process can be used to thin any silicon or nitride layer described herein by oxidizing a portion of the silicon or nitride layer described herein using HDP oxidation and removing said oxidized portion. The HDP oxidation process can also be used to form control oxide layers consisting of an oxide layer on a nitride layer on an oxide layer (an ONO structure).

Preferably, the second dielectric layer 140 comprises oxide, and more preferably, silicon oxide. The HDP oxidation process is conducted at a temperature preferably of less than 700° C., and more preferably less than 400° C. using high density plasma 170. But the temperature can be easily controlled up to 700° C. by adjusting a bias 188 to the substrate 100. The source of oxygen for the high density plasma 170 may be an oxygen containing precursor, or ambient 190, such as $O_2$, $N_2O$, NO, CO, $CO_2$, $H_2O$ or their mixture with any other inert gas (He, Ar, N, etc.), or an oxidizing gas (NO, $N_2O$, $O_2$, etc.). Preferably, the high density plasma 170 is also formed using a hydrogen containing precursor, or ambient 190, such as $H_2$, $NH_3$, $D_2$, $ND_3$. The high density plasma 170 may be generated by any one of a number of sources or HDP generating devices 176, such as HDP CVD tools manufactured by Novellus Systems Inc. of San Jose, Calif. or Applied Materials of Santa Clara, Calif. For example, one of the following sources may be used: helicon; helical-resonator; electron-cyclotron resonance; or inductively coupled plasma generator.

In one embodiment, the HDP generating device 176 is an HDP CVD tool in the SPEED line of tools manufactured by Novellus Systems Inc., of San Jose, Calif. Referring to FIG. 4, the HDP generating device 176 includes a housing 177 having walls 178 surrounding and defining a chamber 171. A coil 180 surrounds the housing 177 and is used to generate an electromagnetic field. Low frequency power is applied to the coil 180 at first through a bias 186. Secondary power may be applied to a wafer holder 182 through the bias 188 to control the temperature of the substrate 100.

The housing 177 forms an opening 184 through which a passageway 172 is formed. The opening 184 allows for an ambient 190 to be introduced into the chamber 171. The ambient 190 is later converted into high density plasma 170 in the chamber 171. The semiconductor substrate 100 rests on a wafer holder 182 within the chamber 171, on which high density plasma 170 is deposited using an HDP oxidation process. The substrate 100 can be unbiased, in which case ionized substances are accelerated by the plasma potential (on the order of 20 Volts) and then implanted into or onto the substrate 100. A bias can be applied to the substrate 100 to further accelerate the ions from the high density plasma and deposit them or implant them deeper into the surface of the substrate 100. Either a DC or RF bias may be applied to the substrate 100.

In one embodiment, the following process conditions are used by the HDP generating device 176 to create an HDP oxidation process used to form the second dielectric layer 140. The HDP generating device 176 is placed in an unbiased and unclamped (UBUC) mode. Preferably, a certain amount of low frequency power is applied to the first power node 186 and a certain amount of high frequency power is applied to the second power node 188. However, in certain applications, high frequency power is applied to the first power node 186 and low frequency power is applied to the second power node 188. The first power node 186 is connected with the coil 180 and the second power node 188 is connected with the wafer holder 182. Preferably, the low frequency power applied has a wattage from 1000 W to 30000 W, and more preferably from 2000 W to 25000 W, and more preferably about 3000 W. Preferably, the low frequency power is applied having a frequency from 100 kHz to 1000 kHz, and more preferably a frequency from 200 kHz to 600 kHz, and even more preferably a frequency of 300 kHz to 500 kHz, and even more preferably about 450 kHz. ±10%, and most preferably greater than 400 kHz and less than 2000 kHz. High frequency power may also be applied to the coil 180. Preferably, no high frequency power is applied, and more preferably high frequency power is applied having a wattage from 0 W to 50 W, and a frequency of between 12 and 14 MHz, and most preferably about 13.56 MHz.

Ambient 190 is introduced into the chamber 171, preferably having a mixture of oxygen and hydrogen. Preferably, the oxygen is O2 having a flow rate from 10 standard cubic centimeters per minute (sccm) to 1000 sccm, and more preferably from 90 sccm to 500 sccm, and most preferably from 100 sccm to 400 sccm. Preferably, the hydrogen is $H_2$ having a flow rate from 10 sccm to 1000 sccm, and more preferably from 90 sccm to 500 sccm, and most preferably from 100 sccm to 400 sccm. Preferably, the flow rate of the $O_2$ is within ±10% of the flow rate of the $H_2$, and more preferably the flow rate of the O2 is within ±5% of the flow rate of the $H_2$, and most preferably the flow rate of the $O_2$ is about the same as the flow rate of the H2. By having and the flow rate of the $O_2$ is within ±10% of the flow rate of the H2, the thickness t0 of the second dielectric layer 140 has good uniformity.

The temperature of the semiconductor substrate 100 on the wafer holder 182 is set in the UBUC mode to a temperature which is preferably less than 700° C., and more preferably less than 400° C., and even more preferably from 300° C. to 400° C., and even more preferably from 325° C. to 375° C., and most preferably about 350° C.±10%. The temperature of the semiconductor substrate 100 can later be controlled by application of bias power (i.e. ion bombardment). Upon setting the above process conditions in the HDP generating device 176, a high density plasma 170 is then created which begins an HDP oxidation process which is used to form the second dielectric layer 140. The amount of time required to run the HDP oxidation process can vary depending on the amount of dielectric material desired for making the second dielectric layer 140. In one embodiment, the HDP oxidation process is run from 10 to 120 seconds, and more preferably from 20 to 60 seconds, and more preferably about 30 seconds ±10%.

In one embodiment, during the formation of a dielectric layer, such as the second dielectric layer 140, a portion of the layer on which the dielectric layer is formed on, such as a portion of the storage layer 130, is oxidized. Upon forming the dielectric layer using HDP oxidation, the dielectric layer, and the oxidized portion of the layer on which the dielectric layer is formed on, are both removed. For example, in one embodiment, the second dielectric layer 140 is formed on a storage layer 130 which comprises $Si_3N_4$ or $SiO_2$, and the thickness of the storage layer 130 is reduced through oxidization of a portion of the storage layer 130. The second dielectric layer 140 and the oxide formed on the storage layer 130 are then removed by applying an etch, such as a hydrofluoric acid (HF) solution, to the second dielectric layer 140, reducing the thickness of the storage layer 130. Preferably, the thickness of the storage layer 130 is measured upon removal of the oxidized portion, and a third dielectric layer (not shown) is formed on the storage layer 130 after the second dielectric layer 140 is removed. Through this process, the individual thickness of a dielectric layer formed, such as the second dielectric layer 140, and the individual thickness of the layer beneath the dielectric layer formed, such as the storage layer 130, can be controlled within ±1 nm.

In one embodiment the first dielectric layer 120 is formed on the semiconductor substrate 100 using the high density plasma (HDP) oxidation process discussed herein. The HDP oxidation process is conducted at a temperature preferably of less than 700° C. using high density plasma 170. The source of oxygen for the high density plasma 170 may be an oxygen containing precursor, or ambient 190, such as of $O_2$, $H_2$, or their mixture with any other inert gas (He, Ar, N, etc.), or an oxidizing gas (NO, $N_2O$, $O_2$, etc.). The high density plasma 170 may be generated by any one of a number of sources or HDP generating devices 176. For example, one of the following sources may be used: helicon; helical-resonator; electron-cyclotron resonance; or inductively coupled plasma generator. By using an HDP oxidation process, the first dielectric layer 120 can be formed with a lower thermal budget than by conventional means.

In one embodiment, upon forming the second dielectric layer 140, the semiconductor structure 116 shown in FIG. 1 is formed by patterning the first dielectric layer 120, the storage layer 130, and the second dielectric layer 140 to form a tunneling structure 122 from the first dielectric layer 120, a storage node 132 from the storage layer 130, and a blocking structure 142 from the second dielectric layer 140. A gate electrode 152 is formed on the blocking structure 142 and first and second sidewall spacers 160 and 162 are formed on each side of the stack of the tunneling structure 122, the storage node 132, the blocking structure 142, and the gate electrode 152, as shown in FIG. 1. Additionally, first and second doped regions 110 and 112 can be formed in the substrate 100. The semiconductor structure 116 can then be placed in a semiconductor device. The storage node 132 can be a floating gate, or can be part of a SONOS device.

Figure 5:
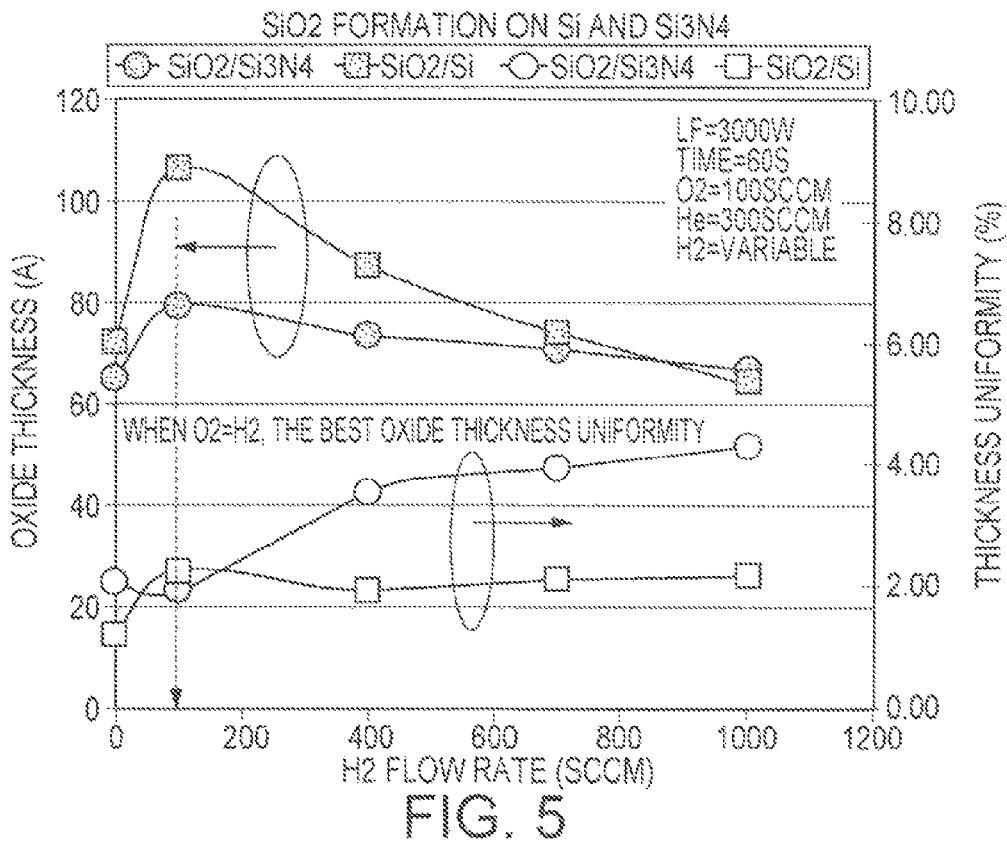
FIGS. 5 and 6 depict charts regarding SiO2 formation on Si and on a $Si_3N_4$ substrate.
Figure 6:
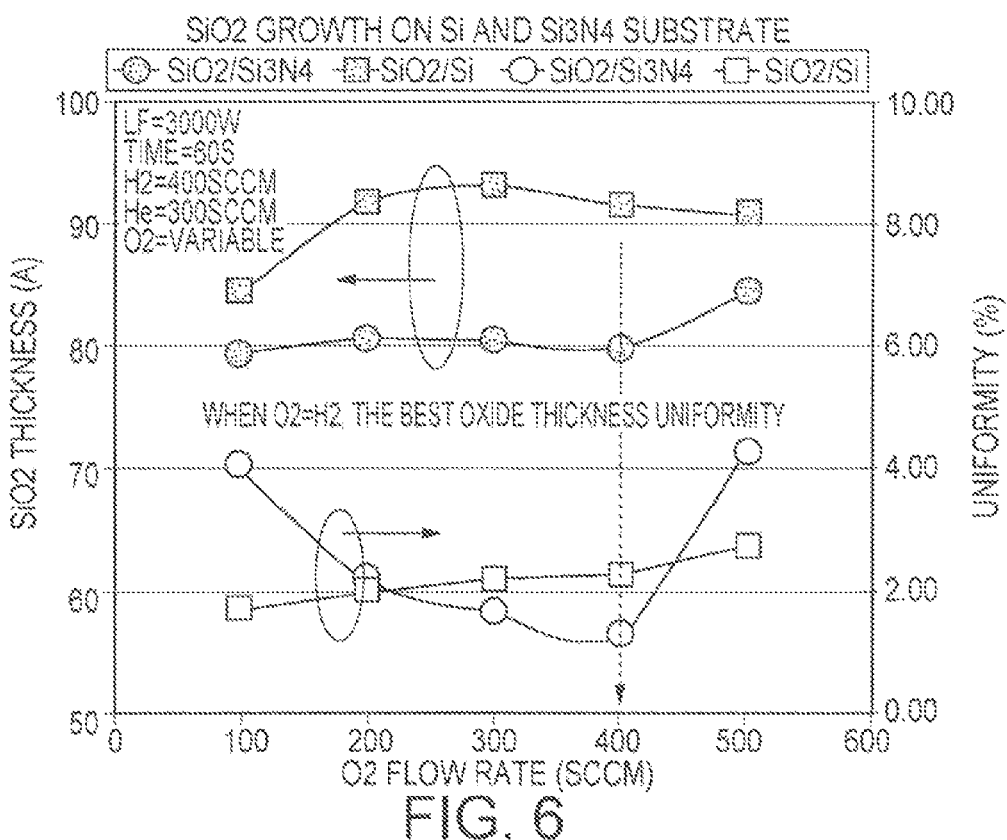

FIGS. 5 and 6 depict charts regarding SiO2 formation on Si and on a Si3N4 substrate. In particular, FIG. 5 depicts a first set of profiles which chart the oxide thickness in angstroms of either $SiO_2$ formed on $Si_3N_4$ or $SiO_2$ formed on Si in relation to the flow rate of $H_2$ in sccm. FIG. 5 depicts a second set of profiles which chart the thickness uniformity in percent of either $SiO_2$ formed on $Si_3N_4$ or $SiO_2$ formed on Si in relation to the flow rate of $H_2$ in sccm. In FIG. 5, the HDP generating device 176 used the following process conditions: a low frequency wattage of 3000 W, a time of 60 seconds, a flow rate of 100 sccm for an $O_2$ ambient, and a flow rate of 300 sccm for a He ambient. As shown in FIG. 5, the best thickness uniformity for the dielectric layer which is formed during the process shown in FIG. 5 occurs when the flow rate of the $O_2$ ambient equals the flow rate of an $H_2$ ambient.

FIG. 6 depicts a second set of profiles which chart the thickness uniformity in percent of either $SiO_2$ formed on $Si_3N_4$ or $SiO_2$ formed on Si in relation to the flow rate of $O_2$ in sccm. In FIG. 6, the HDP generating device 176 used the following process conditions: a low frequency wattage of 3000 W, a time of 60 seconds, a flow rate of 400 sccm for an $H_2$ ambient, and a flow rate of 300 sccm for an He ambient. As shown in FIG. 6, the best thickness uniformity for the dielectric layer which is formed during the process shown in FIG. 6 occurs when the flow rate of the $O_2$ ambient equals the flow rate of an $H_2$ ambient.

Table A, shown below, indicates the Rms, the Ra, and the Rmax, all in angstroms (Å), for the surface roughness of a dielectric layer formed using the above described HDP oxidation process, using an in-situ steam oxidation (ISSG) process, using an HTO process, and using an HTO+(GOX100) process. Table A illustrates how the Rms, the Ra, and the Rmax, are all lowest when using the above described HDP oxidation process. Preferably, the HDP oxidation process forms a second dielectric layer 140 with a surface roughness having a Rms of less than 2.70 Å, and more preferably of less than 2.50 Å and most preferably of less than 2.20 Å. Preferably, the HDP oxidation process forms a second dielectric layer 140 with a surface roughness having a Ra of less than 2.15 Å and more preferably of less than 2.0 Å, and most preferably of less than 1.75 Å. Preferably, the HDP oxidation process forms a second dielectric layer 140 with a surface roughness having a Rmax of less than 26 Å, and more preferably of less than 20 Å and most preferably of less than 19 Å. As a result, use of the HDP oxidation process results in layers, such as the second dielectric layer 140, which have much more uniformity and therefore lower Rms, Ra, and Rmax values than comparable processes. Additionally, the storage layer 130, whose thickness is reduced when using the HDP oxidation process, can also be formed with much more uniformity and therefore lower Rms, Ra, and Rmax values than comparable processes. As a result, the final thickness ($t_f$) of the storage layer 130 can also be greatly reduced with respect to competing deposition processes.

TABLE A

|  | HDP OXIDIZED ON | ON with HTO | ON with HTO + (GOX100) |
|---|---|---|---|
| Rms (Å) | 2.15 (−26%) | 3.02 (+4%) | 2.91 (0%) |
| Ra (Å) | 1.70 (−26%) | 2.39 (+4%) | 2.29 (0%) |
| Rmax (Å) | 18.18 (−38%) | 26.86 (−9%) | 29.41 (0%) |

Figure 7:
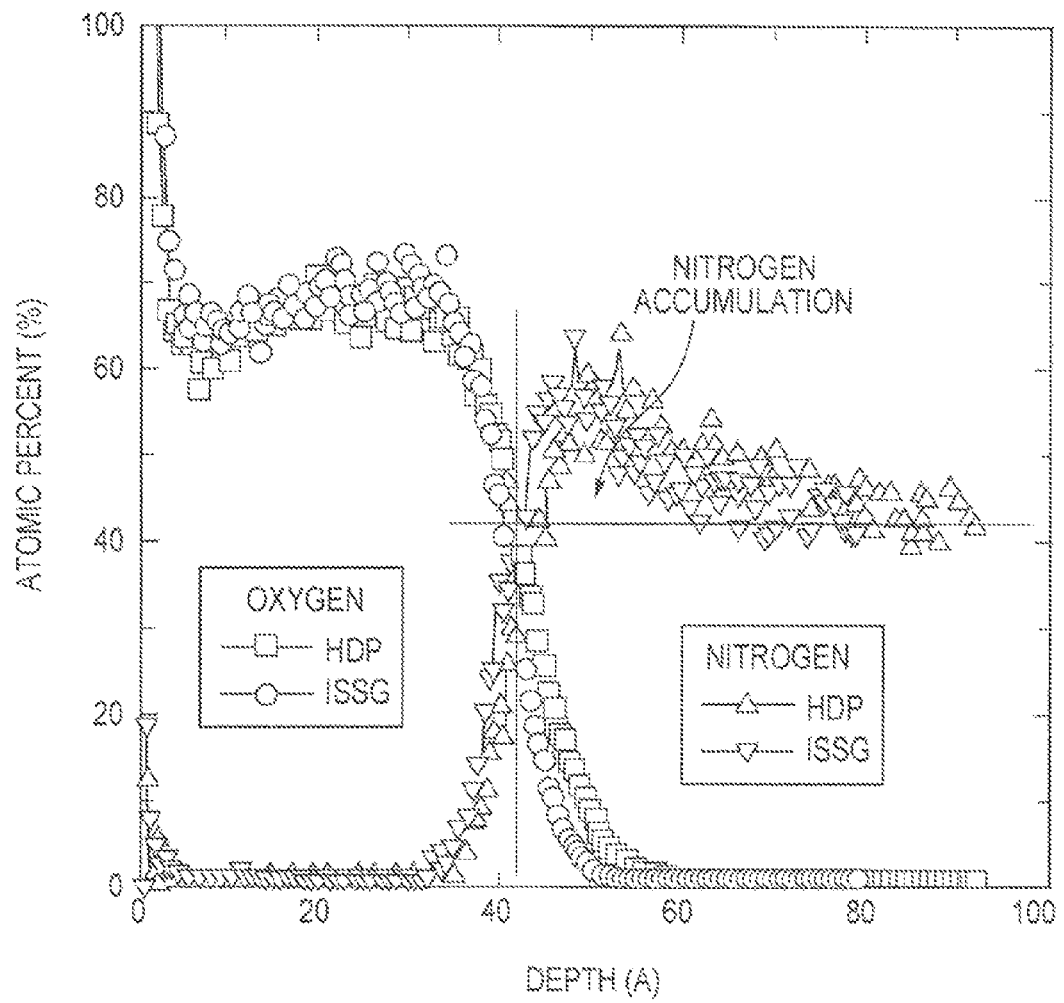
FIG. 7 depicts a chart which compares the differences between nitrogen and oxygen accumulation in atomic percentage at varying depths in a layer when using either a high density plasma oxidation process or an in-situ steam oxidation process.

FIG. 7 depicts a chart which compares the differences between nitrogen and oxygen accumulation in atomic percentage at varying depths in a layer, such as the storage layer 130, when using either a high density plasma oxidation process or an in-situ steam oxidation process. As observed in FIG. 7, when using the high density plasma oxidation process, at a depth exceeding 40 Å, there is more nitrogen and oxygen accumulation by atomic percentage than when using an in-situ steam oxidation process.

Figure 8:
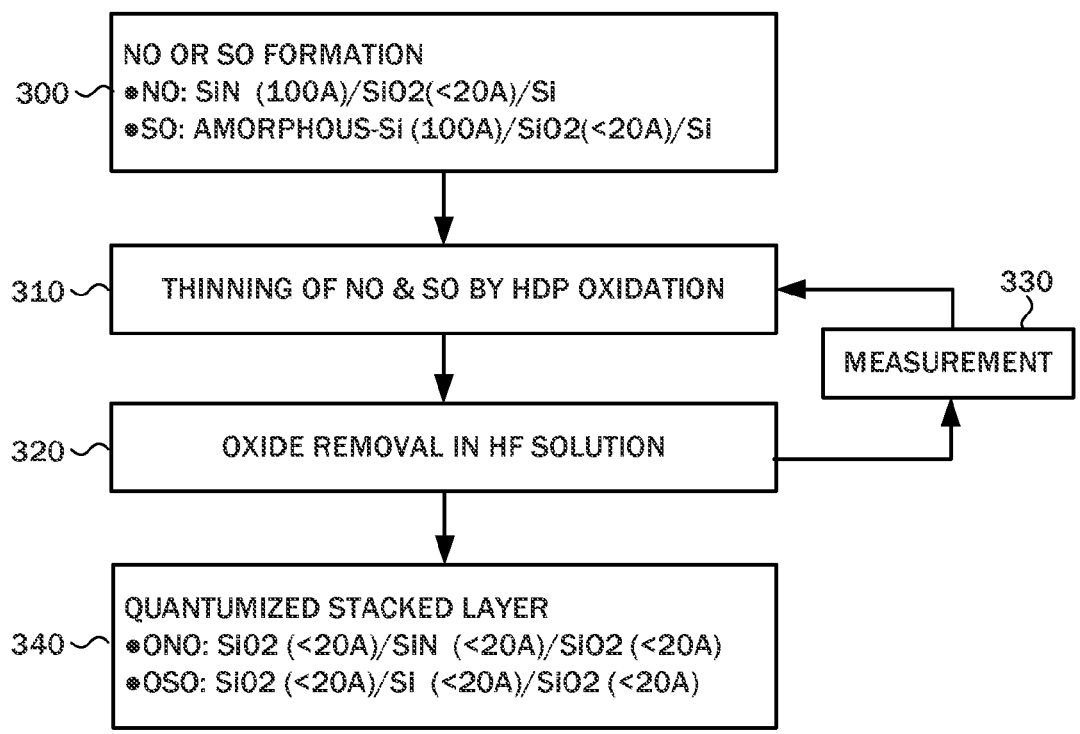
FIG. 8 depicts a flowchart illustration of thickness control of $Si_3N_4$ and Si by repetition of HDP oxidation and dipping in HF solution.

FIG. 8 depicts a flowchart illustration of oxide formation on a dielectric using a high density plasma oxidation process. At 300, a determination is made as to what type of structure is to be formed, either an ONO structure having a second dielectric layer 140 on a storage layer 130 comprising nitride on a first dielectric layer 120, or an OSO structure in which the storage layer 130 comprises silicon. Upon forming the storage layer 130, a second dielectric layer 140 is formed on the storage layer 130 using the above described HDP oxidation process.

In addition to forming the second dielectric layer 140, at 310 the HDP oxidation process also thins the storage layer 130. Upon thinning the storage layer 130, at 320 oxide from the second dielectric layer 140 is removed, preferably using a hydrofluoric acid solution. Upon removing oxide from the second dielectric layer 140, at 330 the thickness of the storage layer 130 is measured. If the thickness is sufficient, then the process moves to 340; if the thickness is insufficient, then the process moves back to 310. At 340, a final dielectric layer is formed on the storage layer 130 to form a quantumized stacked layer having either an ONO structure or an OSO structure. Preferably, each of the layers of either the ONO structure or the OSO structure is less than 50 Å thick and more preferably less than 20 Å thick.

The individual processing steps for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; and Microchip Fabrication 4th edition, Peter Van Zant, McGraw-Hill, 2000.

Obviously, numerous modifications and variations of the present invention are possible in light of the above teachings. It is therefore to be understood that within the scope of the appended claims, the invention may be practiced otherwise than as specifically described herein.

Multi-Layer Charge Storage Structure

In another aspect the present disclosure is directed to memory devices or transistors including an HDP oxide blocking structure and multi-layer charge-storage node. A charge-storage node may be formed with multiple charge storage layers including multiple nitride layers having differing concentrations of oxygen, nitrogen and/or silicon. The nitride layers may include at least a first or bottom nitride layer overlying the tunneling layer and a second or top nitride layer overlying the bottom nitride layer. At least the bottom nitride layer may comprise silicon oxynitride (e.g. SixOyNx). The stoichiometric compositions of the layers may be tailored or selected such that the lower or bottom nitride is oxygen-rich, having a high oxygen to produce an oxygen-rich nitride or oxynitride. The top nitride layer is silicon-rich, nitrogen-rich and oxygen-lean, having a high silicon and a high nitrogen concentration with a low oxygen concentration to produce a silicon-rich nitride or oxynitride. The oxygen-rich bottom nitride layer results in it being a substantially trap free layer, thereby reducing the stored charge loss of charges stored in the top nitride layer without compromising device speed or an initial (beginning of life) difference between program and erase voltages. The silicon-rich, oxygen-lean top nitride layer results in it being a trap dense layer, thereby increasing a difference between programming and erase voltages when the structure is employed in memory devices, improving device speed, increasing data retention, and extending the operating life of the device.

In some embodiments, the silicon-rich, oxygen-lean top oxynitride layer can further include a concentration of carbon of from about 5% to about 9% to increase the number of traps therein.

In other embodiments, the multi-layer charge-storage node structure may further include a middle oxide or anti-tunneling layer between the two nitride layers, forming a split charge storage region comprising two nitride layers separated by a relatively thin oxide layer to further increase charge retention.

Figure 9:
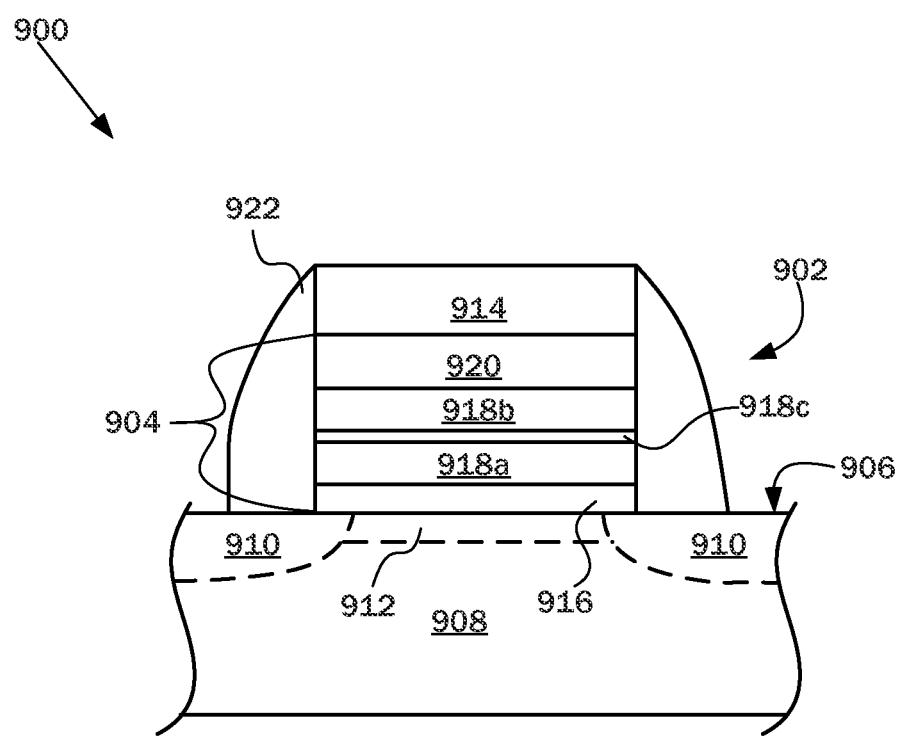
FIG. 9 depicts an edge-on view of a portion of a SONOS type semiconductor device having a blocking structure formed on a multilayer charge storage layer.

FIG. 9 is a block diagram illustrating a cross-sectional side view of one such memory transistor or device 900. The memory device 900 includes a silicon-oxide-nitride-oxide-nitride-oxide-silicon (SONONOS) stack 902 including an ONONO structure 904 formed over a surface 906 of a substrate 908. Substrate 908 includes one or more diffusion regions 910, such as source and drain regions, aligned to the gate stack 902 and separated by a channel region 912. Generally, the SONONOS stack 902 includes a polysilicon or metal gate 914 formed upon and in contact with the ONONO structure 904. The gate 914 is separated or electrically isolated from the substrate 908 by the ONONO structure 904. The ONONO structure 904 includes a thin, lower oxide layer or tunneling layer 916 that separates or electrically isolates a multi-layer charge-storage node 918a-c from the channel region 912, and a blocking oxide layer or blocking structure 920 formed by HDP oxidation as described above. The multi-layer charge-storage node 918a-c includes multiple nitride containing charge storage layers, including a bottom nitride layer 918a, and a top oxynitride layer 918b. Optionally, as in the embodiment shown, the multi-layer charge-storage node 918a-c further includes an intermediate oxide layer or anti-tunneling layer 918c. The memory device 900 further includes first and second dielectric sidewall spacers 922 formed on each side of the stack of the SONONOS stack 902, as shown in FIG. 9.

The various layers of the device 900 may be fabricated to certain thicknesses. Different possibilities for the thicknesses are described herein, representing possible different embodiments. In general, the middle oxide layer will be relatively thin in comparison to the two nitride layers. For example, the middle oxide may be between approximately 5 Å and 20 Å. The nitride layers may be the same or different thicknesses as one another, but will typically be at least approximately 30 Å. With advances in process technology and material science, nitride thicknesses as low as 20 Å may be possible in the near future.

A method of fabricating the memory device 900 of FIG. 9 will now be described with reference to FIGS. 10A, 10B and 11.

Figure 10A:
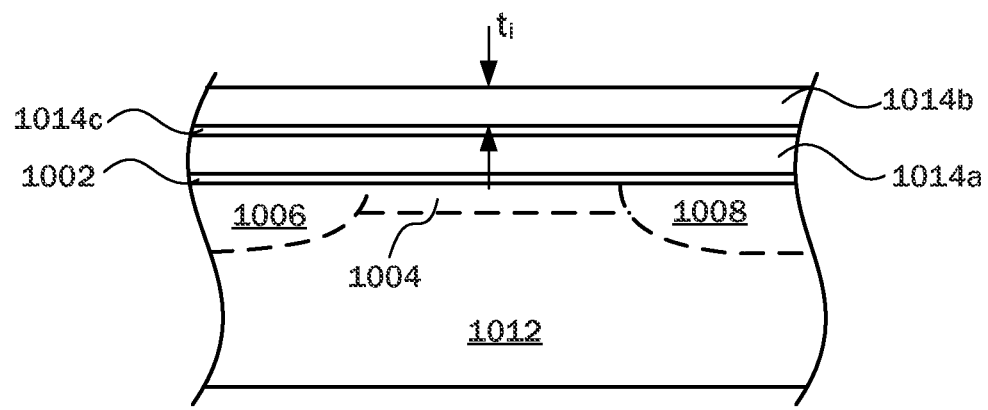
FIGS. 10A-10B depict a series of successive edge-on views for forming a portion of the structure of FIG. 9.
Figure 10B:
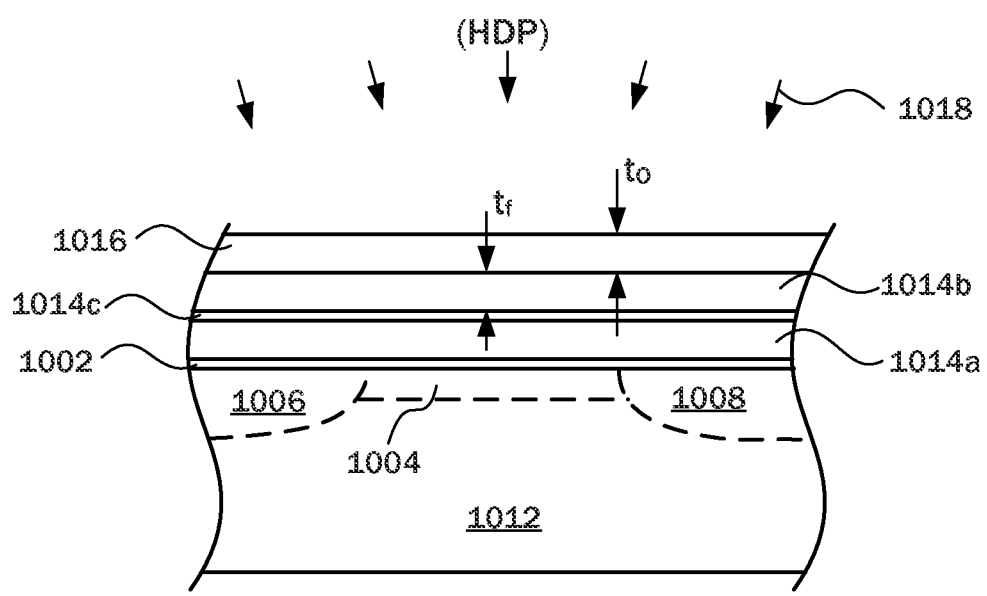
Figure 11:
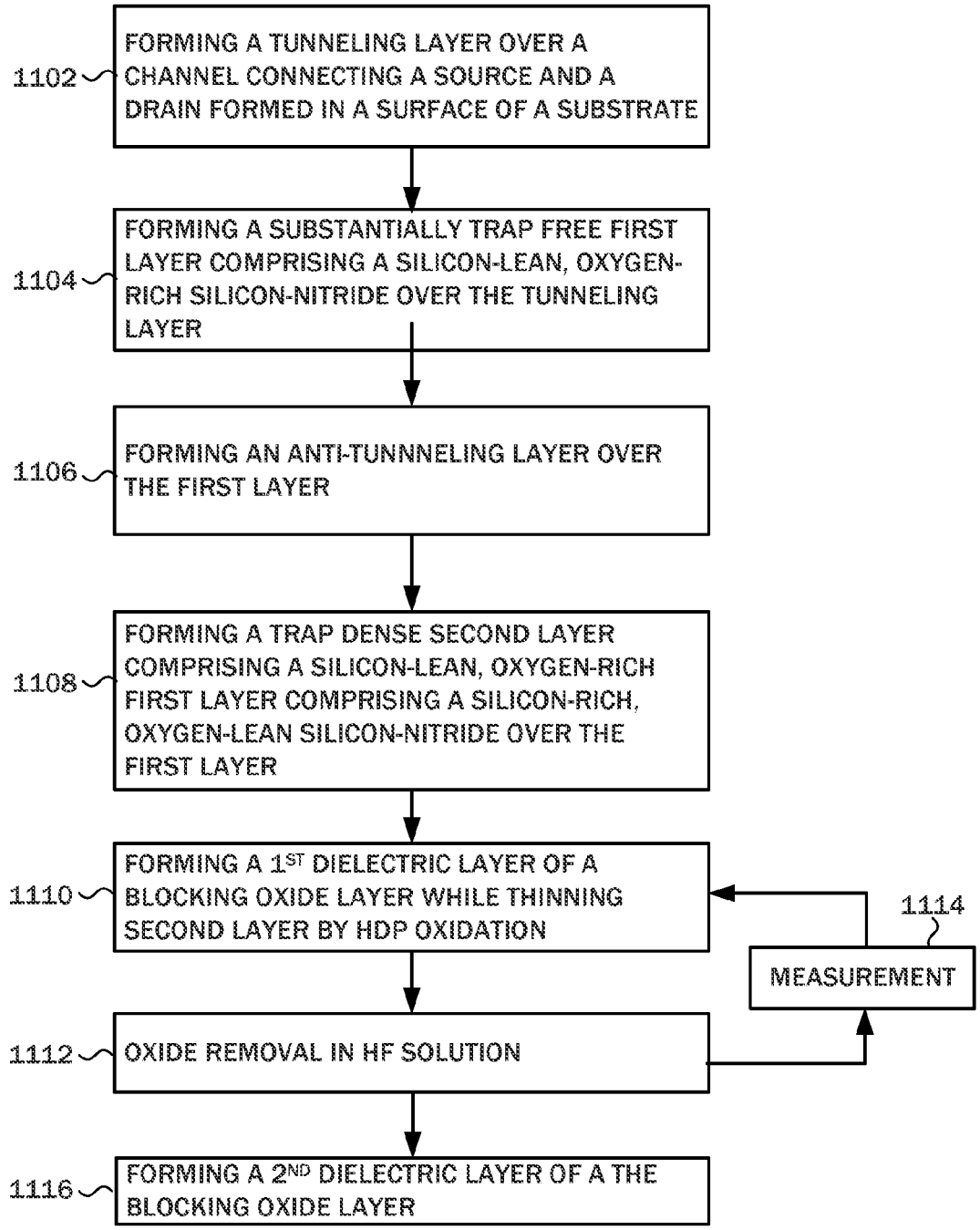
FIG. 11 depicts a flowchart illustrating a method of forming the structure of FIG. 9.

Referring to FIG. 10A and FIG. 11, the process begins with forming a tunneling layer 1002 over a channel 1004 connecting a source 1006 and a drain 1008 formed in a surface of a substrate 1012 (step 1102). As noted above, the tunneling layer 1002 can be formed or deposited by any suitable means, including a plasma oxidation process, In-Situ Steam Generation (ISSG) or a radical oxidation process. In one embodiment, the tunneling layer 1002 is formed in a HDP oxidation performed in an HDP generating device to effect growth of the tunneling layer by oxidation consumption of a portion of the substrate 1012.

Next, the first or bottom nitride or nitride containing layer 1014a of the multi-layer charge-storage node is formed on a surface of the tunneling layer 1002 (step 1104). The bottom nitride layer 1014a can include silicon nitride or silicon oxynitride. In one embodiment, the bottom nitride layer 1014a is formed or deposited in a low pressure CVD process using a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby improving the endurance and retention performance of the SONOS device.

For example, the lower or bottom nitride layer 1014a can be deposited over the tunneling layer 1002 by placing the substrate 1012 in a deposition chamber and introducing a process gas including $N_2O$, $NH_3$ and DCS, while maintaining the chamber at a pressure of from about 5 milliTorr (mT) to about 500 mT, and maintaining the substrate at a temperature of from about 700 degrees Celsius to about 850° C. and in certain embodiments at least about 760° C. for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that a nitride or oxynitride layer produced or deposited under these condition yields an oxygen-rich, bottom nitride layer 1014a.

Optionally, as in the embodiment shown, an anti-tunneling layer 1014c is formed or deposited on a surface of the bottom nitride layer 1014a (step 1106). As with the tunneling layer 1002, the anti-tunneling layer 1014c can be formed or deposited by any suitable means, including a plasma oxidation process, In-Situ Steam Generation (ISSG) or a radical oxidation process. In one embodiment, the radical oxidation process involves flowing hydrogen ($H_2$) and oxygen ($O_2$) gas into a batch-processing chamber or furnace to effect growth of the anti-tunneling layer by oxidation consumption of a portion of the bottom nitride layer 1014a.

The second or top nitride layer 1014b of the multi-layer charge storage layer is then formed on a surface of the anti-tunneling layer 1014c (step 1108) to an initial thickness ($t_i$) of from about 30 to about 130 Å. The top nitride layer 1014b can be deposited over the anti-tunneling layer 1014c in a CVD process using a process gas including $N_2O$, $NH_3$ and DCS, at a chamber pressure of from about 5 mT to about 500 mT, and at a substrate temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean top nitride layer 1014b, which improves the speed and increases of the initial difference between program and erase voltage without compromising a charge loss rate of memory devices made using an embodiment of the silicon-oxide-oxynitride-oxide-silicon structure, thereby extending the operating life of the device.

In some embodiments, the silicon-rich, nitrogen-rich, and oxygen-lean top nitride layer can be deposited over the anti-tunneling layer in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

Either or both of the oxygen-rich first or bottom nitride layer 1014a and the oxygen-lean second or top nitride layer 1014b can be formed in a single wafer tool or in a batch furnace using a CVD process.

Finally, a first dielectric layer 1016 of an HDP oxide blocking structure is formed on a surface of the second layer 1014b of the multi-layer charge storage layer using the above described HDP oxidation process. Referring to FIGS. 10B and 11, the HDP oxidation process begins with forming the first dielectric layer 1016 while thinning the second layer 1014b of the multi-layer charge storage layer (step 1110). The high density plasma may be generated by any one of a number of sources or HDP generating devices, such as described above with respect to FIG. 4. The process conditions used by the HDP generating device to create an HDP oxidation process used to form the first dielectric layer 1016 substantially the same as those described above with respect to FIGS. 2-8. Generally, the HDP oxidation process is conducted using an oxygen containing precursor, or ambient, such as $O_2$, $N_2O$, NO, CO, $CO_2$, $H_2O$ or their mixture with any other inert gas (He, Ar, N, etc.), or an oxidizing gas (NO, $N_2O$, $O_2$, etc.), and, optionally, a hydrogen containing precursor, or ambient, such as $H_2$, $NH_3$, $D_2$, $ND_3$.

In one embodiment, the HDP generating device is placed in an unbiased and unclamped (UBUC) mode, and a low frequency power of from 2000 W to 25000 W at 300 kHz to 500 kHz is applied to the first power node and a high frequency power of from 0 W to 50 W at 12 and 14 MHz, is applied to the second power node connected with the wafer holder. A mixture of oxygen having a flow rate from 100 sccm to 400 sccm and hydrogen having a flow rate from 100 sccm to 400 sccm is introduced into the chamber. The flow rate of the $O_2$ is within ±10% of the flow rate of the $H_2$. By having and the flow rate of the $O_2$ is within ±10% of the flow rate of the $H_2$, the oxide thickness ($t_o$) of the first dielectric layer 1016 has good uniformity. The temperature of the substrate 100 on the wafer holder 182 is set in the UBUC mode to a temperature from 325° C. to 375° C. A high density plasma 1018 is then created which begins an HDP oxidation process which is used to form the first dielectric layer 1016. The amount of time required to run the HDP oxidation process can vary depending on the amount of dielectric material desired for making the first dielectric layer 1016. In one embodiment, the HDP oxidation process is run from 10 to 120 seconds, and more preferably from 20 to 60 seconds, and more preferably about 30 seconds ±10%.

Upon thinning the second layer 1014b of the multi-layer charge storage layer, oxide from the first dielectric layer 1016 is removed using a hydrofluoric acid solution (step 1112). Upon removing oxide from the first dielectric layer 1016, the final thickness ($t_f$) of the second layer 1014b of the multi-layer charge storage layer is measured (step 1114). If a measured thickness is less than a predetermined thickness, i.e., less than about 30 to about 70 Å, then the process moves back to step 1110. If the thickness is sufficient, a second or final dielectric layer is formed on the first dielectric layer of the HDP oxide blocking structure to form a quantumized stacked layer having either an ONNO structure or an ONONO structure (step 1116). In certain embodiments, the final thickness of the top nitride can be from about 20 to about 35 Å and the thickness of the blocking layer can be from about 20 to about 40 may be at least 30 Å.

In another aspect the present disclosure is directed to multigate or multigate-surface memory devices including charge storage regions overlying two or more sides of a channel formed on or above a surface of a substrate, and methods of fabricating the same. Multigate devices include both planar and non-planar devices. A planar multigate device generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 12A:
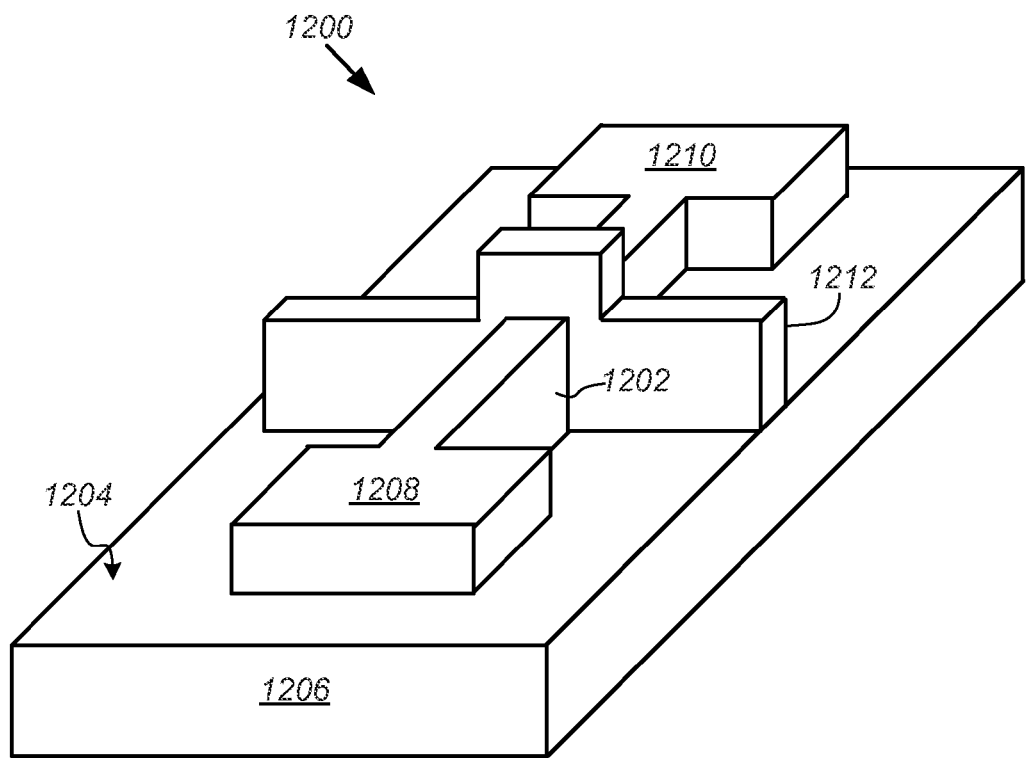
FIG. 12A illustrates a non-planar multigate device including a split charge storage region.
Figure 12B:
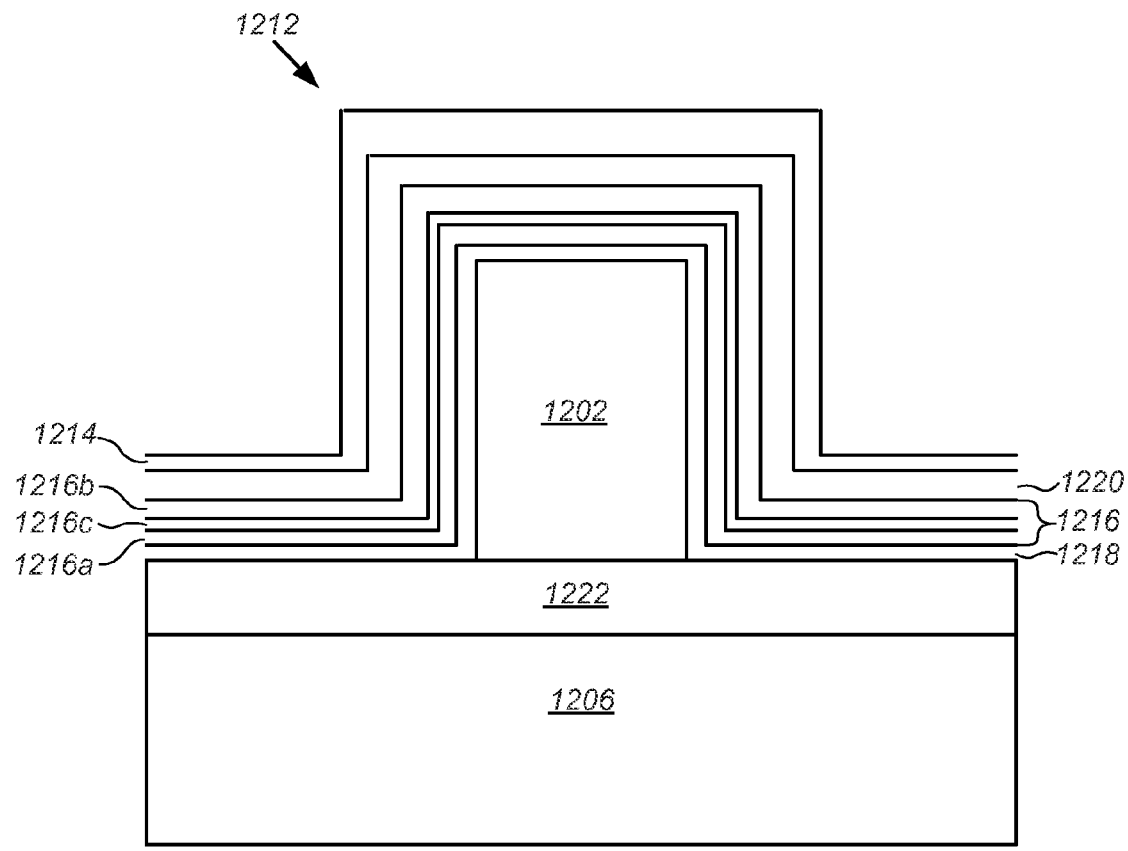
FIG. 12B illustrates a cross-sectional view of the non-planar multigate device of FIG. 12A.

FIGS. 12A and 12B illustrate an embodiment of one such semiconductor memory device 1200. Referring to FIG. 12A, the memory device 1200 includes a channel region 1202 formed from a thin film or layer of semiconducting material overlying a surface 1204 on a substrate 1206 connecting a source region 1208 and a drain region 1210 of the memory transistor. The channel region 1202 is enclosed on three sides by a fin which forms a gate 1212 of the device. The thickness of the gate 1212 (measured in the direction from source region to drain region) determines the effective channel region length of the device. As with the embodiments described above, the channel region 1202 can comprise polysilicon or recrystallized polysilicon to form a monocrystalline channel region. Optionally, where the channel region 1202 includes a crystalline silicon, the channel region can be formed to have <100> surface crystalline orientation relative to a long axis of the channel region.

In accordance with the present disclosure, the non-planar multigate memory device 1200 of FIG. 12A can include a multi-layer charge storage region. FIG. 12B is a cross-sectional view of a portion of the non-planar memory transistor of FIG. 12A including a portion of the substrate 1206, channel region 1202 and the gate 1212 illustrating a gate electrode 1214 and a multi-layer charge storage region 1216. The gate 1212 further includes a tunneling layer 1218 overlying a raised channel region 1202, and an HDP oxide blocking structure 1220 overlying the multi-layer charge storage region 1216 to form a control gate of the memory device 1200. The channel region 1202 and gate 1212 can be formed directly on substrate 1206 or on an insulating or dielectric layer 1222, such as a buried oxide layer, formed on or over the substrate.

As with the embodiments described above, the HDP oxide blocking structure 1220 includes at least first dielectric layer formed on a surface of the second layer 1216b of the multi-layer charge storage layer 1216 using the above described HDP sources or generating devices and process conditions.

The gate electrode 1214 can include a doped polysilicon layer formed or deposited in a low pressure CVD process and can have a thickness of from about 200 Å to about 2000 Å.

The multi-layer charge storage region 1216 includes at least one lower or bottom oxygen-rich first nitride layer 1216a including nitride closer to the tunneling layer 1218, and an upper or top oxygen-lean second nitride layer 1216b overlying the oxygen-rich first nitride layer. Generally, the oxygen-lean second nitride layer 1216b includes a silicon-rich, oxygen-lean nitride layer and includes a majority of a charge traps distributed in the multi-layer charge storage region, while the oxygen-rich first nitride layer 1216a includes an oxygen-rich nitride or silicon oxynitride, and is oxygen-rich relative to the oxygen-lean second nitride layer to reduce the number of charge traps therein. By oxygen-rich it is meant wherein a concentration of oxygen in the oxygen-rich first nitride layer 1216a is from about 15 to about 40%, whereas a concentration of oxygen in oxygen-lean second nitride layer 1216b is less than about 5%.

In some embodiments, such as that shown in FIG. 12B, the multi-layer charge storage region 1216 further includes at least one thin, intermediate or anti-tunneling layer 1216c including a dielectric, such as an oxide, separating the oxygen-lean second nitride layer 1216b from the oxygen-rich first nitride layer 1216a. As noted above, the anti-tunneling layer 1216c substantially reduces the probability of electron charge that accumulates at the boundaries of the oxygen-lean second nitride layer 1216b during programming from tunneling into the first nitride layer 1216a.

As with the embodiments described above, either or both of the oxygen-rich first nitride layer 1216a and the oxygen-lean second nitride layer 1216b can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storage structure is then formed on the middle oxide layer. The oxygen-lean second nitride layer 1216b has a stoichiometric composition of oxygen, nitrogen and/or silicon different from that of the oxygen-rich first nitride layer 1216a, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer. Either or both of the oxygen-rich first nitride layer 1216a and the oxygen-lean second nitride layer 1216b can be formed in a single wafer tool or in a batch furnace using a CVD process.

In those embodiments including an intermediate or anti-tunneling layer 1216c including oxide, the anti-tunneling layer can be formed by oxidation of the bottom oxynitride layer, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

A suitable thickness for the oxygen-rich first nitride layer 1216a may be from about 30 Å to about 160 Å (with some variance permitted, for example ±10 Å), of which about 5-20 Å may be consumed by radical oxidation to form the anti-tunneling layer 1216c. A suitable thickness for the oxygen-lean second nitride layer 1216b may be at least 30 Å. In certain embodiments, the oxygen-lean second nitride layer 1216b may be formed up to 130 Å thick, of which 30-70 Å may be consumed by HDP oxidation to form the HDP oxide blocking structure 1220. A ratio of thicknesses between the oxygen-rich first nitride layer 1216a and oxygen-lean second nitride layer 1216b is approximately 1:1 in some embodiments, although other ratios are also possible.

In other embodiments, the HDP oxide blocking structure 1220 may further include a second or final dielectric layer. Optionally, the final dielectric layer may be a high K dielectric layer. Suitable high K dielectrics include hafnium based materials such as HfSiON, HfSiO or HfO, Zirconium based material such as ZrSiON, ZrSiO or ZrO, and Yttrium based material such as $Y_2O_3$.

In another embodiment, shown in FIGS. 13A and 13B, the memory transistor can include a nanowire channel region formed from a thin film of semiconducting material overlying a surface on a substrate connecting a source region and a drain region of the memory transistor. By nanowire channel region it is meant a conducting channel region formed in a thin strip of semiconducting material. In one version of this embodiment the nanowire is a silicon nanowire with a conducting channel region formed in a thin strip of crystalline silicon material, having a maximum cross-sectional dimension of about 10 nanometers (nm) or less, and more preferably less than about 6 nm.

Referring to FIG. 13A, the memory device or transistor 1300 includes a horizontal nanowire channel region 1302 formed from a thin film or layer of semiconducting material on or overlying a surface on a substrate 1306, and connecting a source region 1308 and a drain region 1310 of the memory transistor. In the embodiment shown, the device has a gate-all-around (GAA) structure in which the nanowire channel region 1302 is enclosed on all sides by a gate 1312 of the device. The thickness of the gate 1312 (measured in the direction from source region to drain region) determines the effective channel region length of the device. As with the embodiments described above, the nanowire channel region 1302 can comprise polysilicon or recrystallized polysilicon to form a monocrystalline channel region. Optionally, where the channel region 1302 includes a crystalline silicon, the channel region can be formed to have <100> surface crystalline orientation relative to a long axis of the channel region.

In accordance with the present disclosure, the non-planar multigate memory transistor 1300 of FIG. 13A can include a multi-layer charge storage region and an HDP oxide blocking structure formed at least in part by oxidation of a top layer of the multi-layer charge storage region. FIG. 13B is a cross-sectional view of a portion of the non-planar memory transistor of FIG. 13A including a portion of the substrate 1306, nanowire channel region 1302 and the gate 1312. Referring to FIG. 13B, the gate 1312 includes a tunneling layer 1318 overlying the nanowire channel region 1302, a multi-layer charge storage region 1316a-1316c, an HDP oxide blocking structure 1320, and a gate electrode 1314.

As with the embodiments described above, the HDP oxide blocking structure 1320 includes at least first dielectric layer formed on a surface of the second layer 1316b of the multi-layer charge storage layer 1316 using the above described HDP sources or generating devices and process conditions.

The gate electrode 1314 includes a doped polysilicon layer formed or deposited in a low pressure CVD process and having a thickness of from about 200 Å to about 2000 Å. The polysilicon layer of the gate electrode 1314 can be formed or grown directly as a doped polysilicon layer through the addition of gases such as phosphine, arsine, diborane or $BF_2$.

The multi-layer charge storage region 1316a-13716c includes at least one inner oxygen-rich first nitride layer 1316a comprising nitride closer to the tunneling layer 1318, and an outer oxygen-lean second nitride layer 1316b overlying the oxygen-rich first nitride layer. Generally, the outer oxygen-lean second nitride layer 1316b comprises a silicon-rich, oxygen-lean nitride layer and comprises a majority of a charge traps distributed in the multi-layer charge storage region, while the oxygen-rich first nitride layer 1316a comprises an oxygen-rich nitride or silicon oxynitride, and is oxygen-rich relative to the outer oxygen-lean second nitride layer to reduce the number of charge traps therein.

In some embodiments, such as that shown, the multi-layer charge storage region 1316 further includes at least one thin, intermediate or anti-tunneling layer 1316c comprising a dielectric, such as an oxide, separating outer oxygen-lean second nitride layer 1316b from the oxygen-rich first nitride layer 1316a. The anti-tunneling layer 1316c substantially reduces the probability of electron charge that accumulates at the boundaries of outer oxygen-lean second nitride layer 1316b during programming from tunneling into the oxygen-rich first nitride layer 1316a, resulting in lower leakage current.

As with the embodiment described above, either or both of the oxygen-rich first nitride layer 1316a and the outer oxygen-lean second nitride layer 1316b can comprise silicon nitride or silicon oxynitride, and can be formed, for example, by a CVD process including $N_2O/NH_3$ and DC S/$NH_3$ gas mixtures in ratios and at flow rates tailored to provide a silicon-rich and oxygen-rich oxynitride layer. The second nitride layer of the multi-layer charge storage structure is then formed on the middle oxide layer. The outer oxygen-lean second nitride layer 1316b has a stoichiometric composition of oxygen, nitrogen and/or silicon different from that of the oxygen-rich first nitride layer 1316a, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1316c comprising oxide, the anti-tunneling layer can be formed by oxidation of the oxygen-rich first nitride layer 1316a, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

A suitable thickness for the oxygen-rich first nitride layer 1316a may be from about 30 Å to about 80 Å (with some variance permitted, for example ±10 Å), of which about 5-20 Å may be consumed by radical oxidation to form the anti-tunneling layer 1316c. A suitable thickness for the outer oxygen-lean second nitride layer 1316b may be at least 30 Å. In certain embodiments, the outer oxygen-lean second nitride layer 1316b may be formed up to 70 Å thick, of which 30-70 Å may be consumed by HDP oxidation to form the HDP oxide blocking structure 1320. A ratio of thicknesses between the oxygen-rich first nitride layer 1316a and the outer oxygen-lean second nitride layer 1316b is approximately 1:1 in some embodiments, although other ratios are also possible.

In other embodiments, the HDP oxide blocking structure 1320 may further include a second or final dielectric layer. Optionally, the final dielectric layer may be a high K dielectric layer. Suitable high K dielectrics include hafnium based materials such as HfSiON, HfSiO or HfO, Zirconium based material such as ZrSiON, ZrSiO or ZrO, and Yttrium based material such as $Y_2O_3$.

FIG. 13C illustrates a cross-sectional view of a vertical string of non-planar multigate transistors 1300 of FIG. 13A arranged in a Bit-Cost Scalable or BiCS architecture 1326. The BiCS architecture 1326 consists of a vertical string or stack of non-planar multigate transistors 1300, where each device or cell includes a nanowire channel region 1302 overlying the substrate 1306, and connecting a source region and a drain region (not shown in this figure) of the memory transistor, and having a gate-all-around (GAA) structure in which the nanowire channel region 1302 is enclosed on all sides by a gate 1312. The BiCS architecture reduces number of critical lithography steps compared to a simple stacking of layers, leading to a reduced cost per memory bit.

In another embodiment, the memory transistor is or includes a non-planar device comprising a vertical nanowire channel region formed in or from a semiconducting material projecting above or from a number of conducting, semiconducting layers on a substrate. In one version of this embodiment, shown in cut-away in FIG. 14A, the memory transistor 1400 comprises a vertical nanowire channel region 1402 formed in a cylinder of semiconducting material connecting a source region 1404 and drain region 1406 of the device. The channel region 1402 is surrounded by a tunneling layer 1408, a multi-layer charge storage region 1410, a HDP oxide blocking structure 1412 and an electrode 1414 overlying the HDP oxide blocking structure to form a control gate of the memory transistor 1400. The channel region 1402 can include an annular region in an outer layer of a substantially solid cylinder of semiconducting material, or can include an annular layer formed over a cylinder of dielectric filler material. As with the horizontal nanowires described above, the channel region 1402 can comprise polysilicon or recrystallized polysilicon to form a monocrystalline channel region. Optionally, where the channel region 1402 includes a crystalline silicon, the channel region can be formed to have <100> surface crystalline orientation relative to a long axis of the channel region.

Figure 14A:
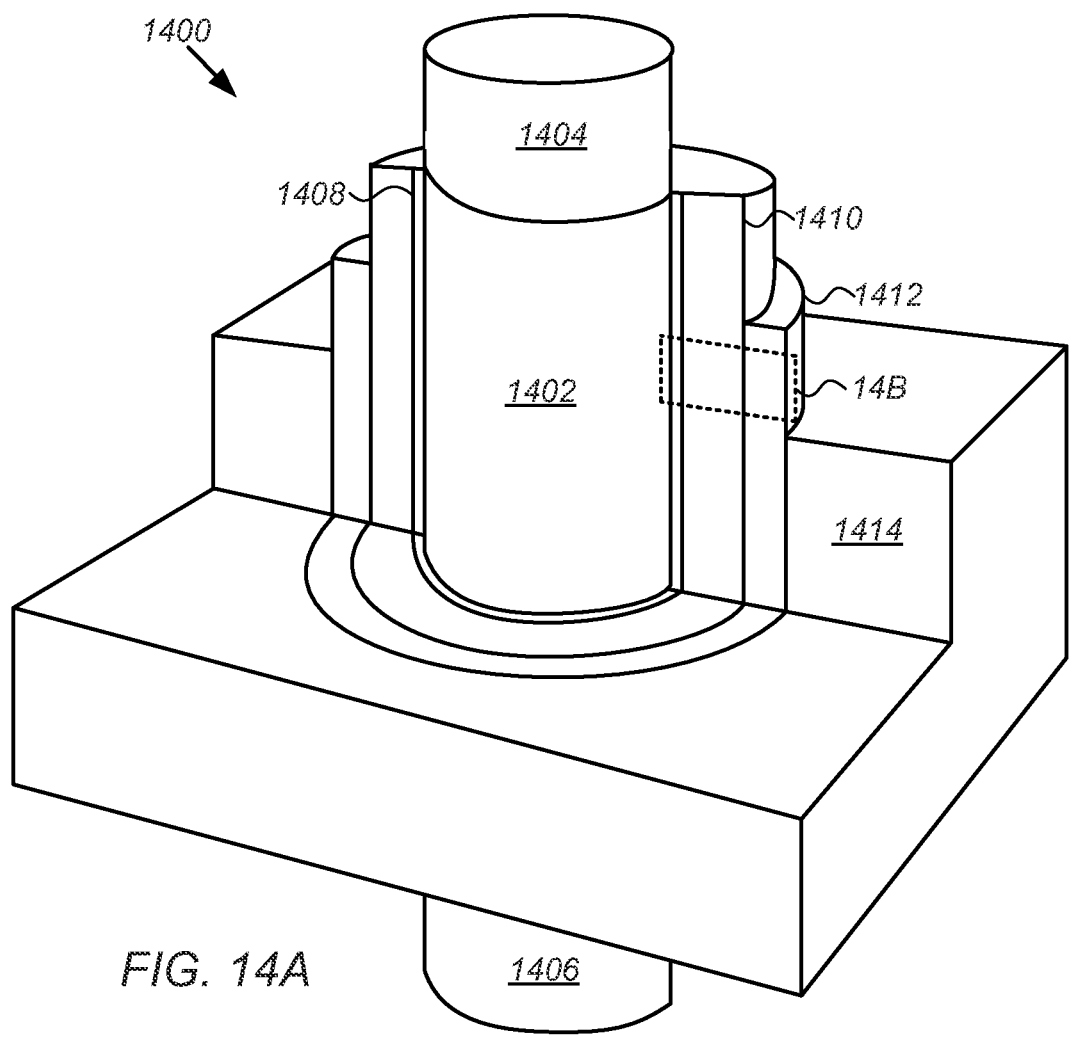
FIGS. 14A and 14B illustrate a non-planar multigate device including a split charge storage region and a vertical nanowire channel.
Figure 14B:
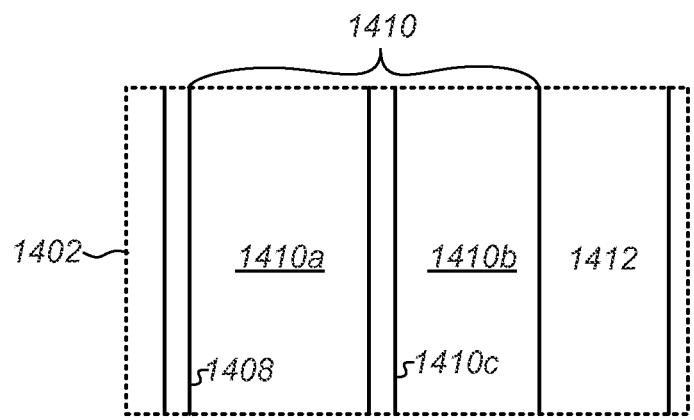

In some embodiments, such as that shown in FIG. 14B, the multi-layer charge storage region 1410 includes at least an inner or oxygen-rich first nitride layer 1410a closest to the tunneling layer 1408, and an outer or oxygen-lean second nitride layer 1410b. Optionally, as in the embodiment shown, the oxygen-rich first nitride layer 1410a and the oxygen-lean second nitride layer 1410b are separated by an intermediate oxide or anti-tunneling layer 1410c comprising oxide.

Either or both of the oxygen-rich first nitride layer 1410a and the oxygen-lean second nitride layer 1410b can comprise silicon nitride or silicon oxynitride, and can be formed, for example, by a CVD process including $N_2O/NH_3$ and DCS/$NH_3$ gas mixtures in ratios and at flow rates tailored to provide a silicon-rich and oxygen-rich oxynitride layer.

As with the embodiments described above, the HDP oxide blocking structure 1412 includes at least first dielectric layer formed on a surface of the second layer 1410b of the multi-layer charge storage layer 1410 using the above described HDP sources or generating devices and process conditions.

Finally, either or both of the oxygen-lean second nitride layer 1410b and the HDP oxide blocking structure 1412 may comprise a high K dielectric, such as HfSiON, HfSiO, HfO, ZrSiON, ZrSiO, ZrO, or $Y_2O_3$.

Figure 15A:
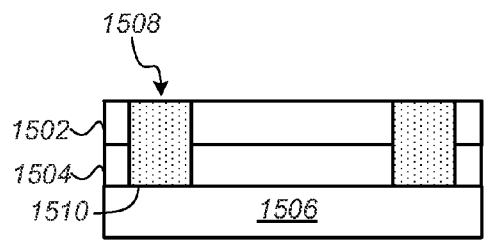
FIG. 15A through 15F illustrate a gate last scheme for fabricating the non-planar multigate device of FIG. 14A.

Referring to FIGS. 15A-15F, the memory transistor 1400 of FIG. 14A can be made using a gate last scheme. Referring to FIG. 15A, in a gate last scheme a dielectric layer 1502, such as an oxide, is formed over a sacrificial layer 1504 on a surface on a substrate 1506, an opening etched through the dielectric and sacrificial layers and a vertical channel region 1508 formed therein. As with embodiments described above, the vertical channel region 1508 can include an annular region in an outer layer of a substantially solid cylinder of semiconducting material 1510, such as polycrystalline or monocrystalline silicon, or can include a separate, layer semiconducting material surrounding a cylinder of dielectric filler material (not shown). The dielectric layer 1502 can comprise any suitable dielectric material, such as a silicon oxide, capable of electrically isolating the subsequently formed gate electrode of the memory transistor 800 from an overlying electrically active layer or another memory transistor.

Figure 15B:
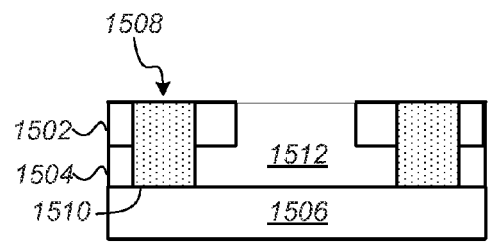

Referring to FIG. 15B, a second opening 1512 is etched through the etched through the dielectric layer 1502 and sacrificial layer 1504 to the substrate 1506, and the sacrificial layer 1504 at least partially etched or removed. The sacrificial layer 1504 can comprise any suitable material that can be etched or removed with high selectivity relative to the material of the dielectric layer 1502, substrate 1506 and vertical channel region 1508. In one embodiment the sacrificial layer 1504 comprises an oxide that can be removed by Buffered Oxide Etch (BOE etch).

Figure 15C:
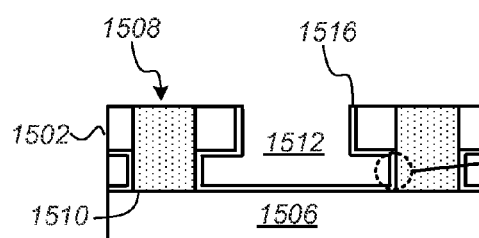
Figure 15D:
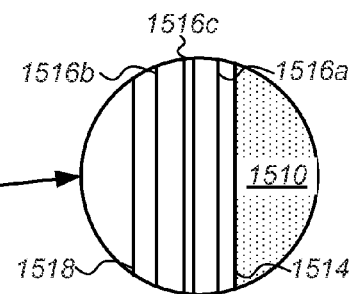

Referring to FIGS. 15C and 15D, a tunneling layer 1514, a multi-layer charge storage region 1516A-C, and an HDP oxide blocking structure 1518 are sequentially deposited in the opening, and the surface of the dielectric layer 1502 planarized to yield the intermediate structure shown in FIG. 15C.

As in the embodiments described above, HDP oxide blocking structure 1518 includes at least first dielectric layer formed on a surface of the second layer 1516b of the multi-layer charge storage layer 1516 using the above described HDP sources or generating devices and process conditions.

The multi-layer charge storage layer 1516A-C is a split multi-layer charge storage layer including at least an inner oxygen-rich first nitride layer 1516A closest to the tunneling layer 1514, and an outer, oxygen-lean second nitride layer 1516B. Optionally, the first and second charge storage layers can be separated by an intermediate oxide or anti-tunneling layer 1516c.

Figure 15E:
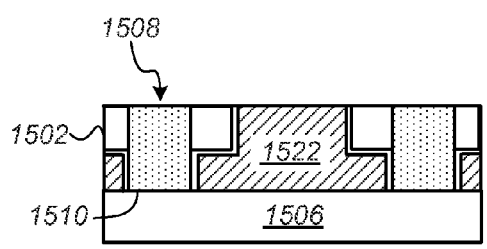
Figure 15F:
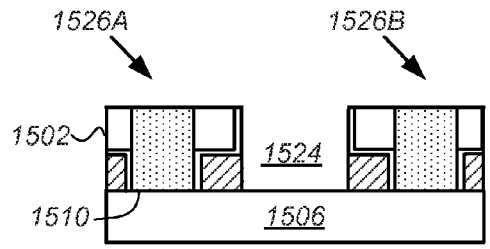

Next, a gate electrode layer 1522 is deposited into the second opening 1512 and the surface of the upper dielectric layer 1502 planarized to yield the intermediate structure illustrated in FIG. 15E. As with the embodiments described above, the gate electrode layer 1522 includes a doped polysilicon layer having a dopant concentration of from about 1e14 $cm^{-2}$ to about 1e16 $cm^{-2}$ so that the minimum energy needed to remove an electron from the gate electrode is from at least about 4.8 eV to about 5.3 eV. The polysilicon layer of the gate electrode layer 1522 is grown directly as a doped polysilicon layer through the addition of gases such as phosphine, arsine, diborane or $BF_2$, to the CVD process. Finally, an opening 1524 is etched through the gate electrode layer 1522 to form control gates of separate memory devices 1526A and 1526B.

Thus, a method for fabricating a nonvolatile charge trap memory device has been disclosed. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
    forming a tunneling layer over a channel connecting a source and a drain formed in a surface of a substrate;
    forming a charge storage layer overlying the tunneling layer, the charge storage layer comprises forming a substantially trap free first layer over the tunneling layer, and forming a trap dense second layer over the first layer;
    forming a blocking structure on the charge storage layer by high density plasma (HDP) oxidation, wherein a thickness of the charge storage layer is reduced through oxidation of a portion of the charge storage layer during forming the blocking structure;
    removing at least a portion of the blocking structure;
    measuring the thickness of the charge storage layer, and if a measured thickness exceeds a predetermined thickness repeating the forming and removing of the blocking structure to further reduce the thickness of the charge storage layer; and
    if the measured thickness is less than the predetermined thickness forming a final blocking structure on the charge storage layer.

2. The method of claim 1, wherein forming the charge storage layer comprises forming an oxygen-rich first layer comprising a silicon nitride, and a silicon-rich, oxygen-lean, second layer comprising a silicon nitride.

3. The method of claim 2, wherein the second layer further comprises a concentration of carbon to increase a number of traps therein.

4. A method comprising:
    forming a charge storage layer overlying a tunneling layer on a substrate, the charge storage layer comprising a substantially trap free, oxygen-rich first layer comprising a nitride over the tunneling layer, and a trap dense, silicon-rich, oxygen-lean second layer comprising a nitride over the first layer; and
    forming a blocking structure on the second layer of the charge storage layer by high density plasma (HDP), wherein a thickness of the second layer is reduced through oxidation of a portion of the second layer during forming the blocking structure;
    removing at least a portion of the blocking structure;
    measuring the thickness of the charge storage layer, and if a measured thickness exceeds a predetermined thickness repeating the forming and removing of the blocking structure to further reduce the thickness of the second layer of the charge storage layer; and
    if the measured thickness is less than the predetermined thickness forming a final blocking structure on the charge storage layer.

5. The method of claim 4, wherein the first layer comprises a silicon oxynitride, and the second layer comprises a silicon oxynitride.

6. The method of claim 4, wherein the second layer further comprises a concentration of carbon selected to increase a number of traps therein.

7. The method of claim 4, wherein forming the charge storage layer further comprises forming an anti-tunneling layer separating the first layer from the second layer.

8. A method comprising:
    forming a tunneling layer over a channel connecting a source and a drain formed in a surface of a substrate;
    forming a charge storage layer overlying a tunneling layer on a substrate, the charge storage layer comprising a substantially trap free first layer over the tunneling layer, an anti-tunneling layer comprising an oxide over the first layer, and a trap dense second layer over the anti-tunneling layer;
    forming a blocking structure on the charge storage layer by plasma oxidation, wherein a thickness of the charge storage layer is reduced through oxidation of a portion of the charge storage layer during forming the blocking structure;
    removing at least a portion of the blocking structure;
    measuring the thickness of the charge storage layer, and if a measured thickness exceeds a predetermined thickness repeating the forming and removing of the blocking structure to further reduce the thickness of the second layer of the charge storage layer; and
    if the measured thickness is less than the predetermined thickness forming a final blocking structure on the charge storage layer.

9. The method of claim 8, wherein forming the charge storage layer comprises forming an oxygen-rich first layer comprising a silicon oxynitride, and a silicon-rich, oxygen-lean, second layer comprising a silicon oxynitride.

* * * * *